United States Patent
Prabhu et al.

(10) Patent No.: US 7,205,095 B1
(45) Date of Patent: Apr. 17, 2007

(54) APPARATUS AND METHOD FOR PACKAGING IMAGE SENSING SEMICONDUCTOR CHIPS

(75) Inventors: Ashok Prabhu, San Jose, CA (US); Shaw Wei Lee, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 241 days.

(21) Appl. No.: 10/666,921

(22) Filed: Sep. 17, 2003

(51) Int. Cl.
*G03C 5/00* (2006.01)
*H01L 31/0203* (2006.01)

(52) U.S. Cl. .................. 430/311; 257/434; 257/433; 257/435; 250/239; 250/208.1

(58) Field of Classification Search ............. None
See application file for complete search history.

(56) References Cited

U.S. PATENT DOCUMENTS

| | | | |
|---|---|---|---|
| 4,697,203 A | 9/1987 | Sakai et al. | |
| 5,734,156 A | 3/1998 | Dahlin et al. | |
| 5,818,094 A | 10/1998 | Matsuo | |
| 5,920,142 A * | 7/1999 | Onishi et al. | 310/313 R |
| 6,075,237 A | 6/2000 | Ciccarelli | |
| 6,117,193 A | 9/2000 | Glenn | |
| 6,291,884 B1 | 9/2001 | Glenn et al. | |
| 6,873,024 B1 * | 3/2005 | Prabhu et al. | 257/434 |
| 2005/0030505 A1 * | 2/2005 | Miwa | 355/53 |

OTHER PUBLICATIONS

Website http://www.shellcase.com/pages/products.asp,. downloaded Jul. 23, 2003, 2 pages.
Website http://www.shellcase.com/pages/products-shellOP-process.asp, downloaded Jul. 23, 2003, 4 pages.
Website www.hanagroup.com/h_hmti.htm. "Hana Microdisplay Technologies, Inc.", downloaded Sep. 17, 2003, Aug. 9, 2002.
Website http://www.shellcase.com, Shellcase, "SellOP Precess Flow," Steps A-J, Oct. 2001.

* cited by examiner

*Primary Examiner*—John A. McPherson
*Assistant Examiner*—Daborah Chacko-Davis
(74) *Attorney, Agent, or Firm*—Beyer Weaver LLP

(57) ABSTRACT

An method and apparatus for fabricating a die having imaging circuitry and fabricating a lid having a transparent region and support regions having a predetermined height. The lid is fabricated by applying a photo-sensitive adhesive layer with a thickness substantially equal to the predetermined height to a transparent plate and patterning the photo-sensitive adhesive layer to form the transparent region and the support regions. Once fabrication of the lid is complete, it is mounted directly onto the die so that the transparent region generally covers the imaging circuitry. The resulting apparatus includes a lid mounted directly onto the die with the transparent region generally positioned above the imaging circuitry. A gap, having a height dimension substantially equal to the predetermined height of the support regions of the lid, is spaced between the transparent region of the lid and the imaging circuitry on the die.

10 Claims, 5 Drawing Sheets

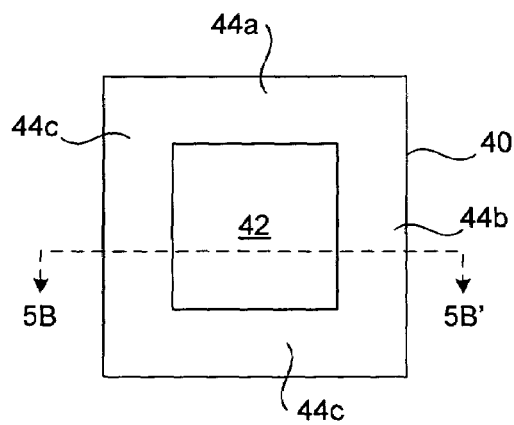
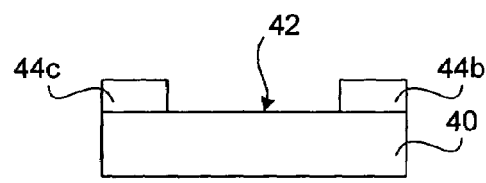
*FIG. 5A*  *FIG. 5B*
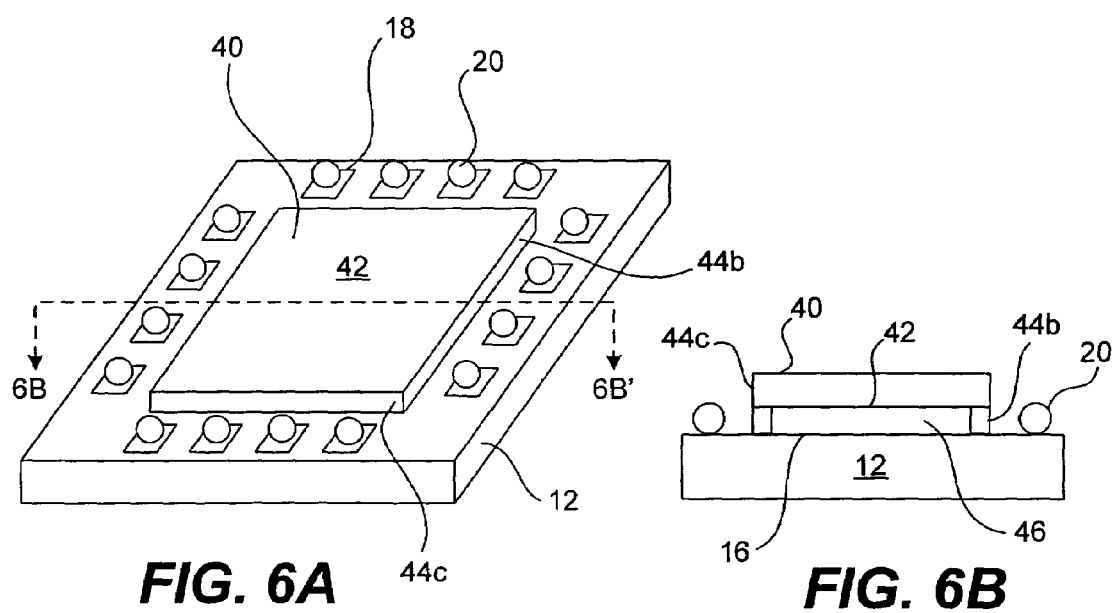
*FIG. 6A*  *FIG. 6B*

APPARATUS AND METHOD FOR PACKAGING IMAGE SENSING SEMICONDUCTOR CHIPS

FIELD OF THE INVENTION

The present invention relates generally to the packaging of semiconductor devices, and more particularly, to an apparatus and method of packaging optical imaging semiconductor devices.

BACKGROUND OF THE INVENTION

Optical imaging semiconductors, such as CMOS imaging sensors or Charge Couple Devices (CCDs), are capable of generating images from received light waves. Imaging semiconductor devices are usually encapsulated in a package that has a window made of glass, plastic or some other translucent material, that allows light to impinge onto the light sensitive circuitry of the device.

One known type of packaging for optical semiconductor devices involves the use of a multi-piece ceramic package commonly called a leadless chip carrier (LCC). The package includes a ceramic substrate including a die attach area. An integrated circuit (IC) such as an imaging chip, is attached to the die attach area. A ceramic contact template having electrical contact pads is provided around the periphery of the package and surrounding the chip. Electrical connections, such a wire bonds, are formed between the chip and the pads on the contact template. The height of the contact template is approximately the same as that of the chip on the ceramic substrate. A ceramic spacer is provided on top of the contact template around the periphery of the package. A transparent cover, such as glass, is then mounted and hermetically sealed on top of the ceramic spacer. Recess regions, sometimes referred to as castellations, are formed on the exterior periphery of the package. The purpose of the castellations is to provide electrical traces from the contact pads of the contact template to the underside of the package. Contacts located on the underside of the package, such as solder balls, are used to electrically connect the chip inside the package to other electrical devices such as those on a printed circuit board. In alternative examples of an LCC package for optical chips, the substrate, contact template and the spacer can all be made of a plastic, such as epoxy.

There are a number of problems associated with the aforementioned package. One significant problem is maintaining the proper tolerances for the chip package. With imaging applications, the IC includes imaging circuitry. The imaging circuitry needs to be at a focal point with respect to the lens used to provide images onto the IC. With the multi-piece, multi-level package described above, it is relatively difficult to manufacture and assemble the package with the precise tolerances needed to assure that the IC is within the focal plane of the lens. Another problem with the aforementioned package is that the IC is susceptible to contamination during assembly. The IC is attached to the substrate in an initial manufacturing step. Thereafter, numerous other steps are performed, such a wire bonding, attaching the contact template, and the spacer template, etc. During each of these steps, the IC is exposed to elements and dust particles that can readily contaminate the pixel area on the chip. Since the IC is protected from contamination only after the glass cover is attached to the package, there is a relatively high probability that the chip will be damaged, thereby reducing yields. Furthermore, ceramic packages are relatively expensive. They require assembly as single units and are generally not amenable to mass production semiconductor fabrication techniques. Ceramic LCC packages have reliability problems and are expensive.

Another type of wafer-level packaging for optical semiconductor devices involves the use of two layers of glass. With this package, a first layer of glass is attached to the active surface of a wafer using an optically clear epoxy and a second layer of glass is attached to the bottom surface of the wafer also using an epoxy. Solder bumps are formed on the second layer of glass underneath the wafer. Individual packages are formed by scribing the wafer. Metal traces, sometimes called "T-junctions", are formed between bond pad contacts formed on the top of each die and exposed during the scribing process and the solder bumps formed on the bottom of the package. The problem with this type of package is that the T-junctions tend to be unreliable. Also, the use of the optically clear epoxy on the active surface of the wafer tends to scatter the light impinging on the light sensitive circuitry of the chip. This may reduce the efficiency of the imaging circuitry.

An apparatus and method of wafer level packaging of optical imaging die using conventional semiconductor packaging techniques is therefore needed.

SUMMARY OF THE INVENTION

To achieve the foregoing, and in accordance with the purpose of the present invention, a method and apparatus for wafer level packaging of optical imaging die using conventional semiconductor packaging techniques is disclosed. The method includes fabricating a die having imaging circuitry and fabricating a lid having a transparent region and support regions having a predetermined height. The lid is fabricated by applying a photo-sensitive adhesive layer with a thickness substantially equal to the predetermined height to a transparent plate and patterning the photo-sensitive adhesive layer to form the transparent region and the support regions. Once fabrication of the lid is complete, it is mounted directly onto the die so that the transparent region generally covers the imaging circuitry. The resulting apparatus includes a lid mounted directly onto the die with the transparent region generally positioned above the imaging circuitry. A gap, having a height dimension substantially equal to the predetermined height of the support regions of the lid, is spaced between the transparent region of the lid and the imaging circuitry on the die. In one embodiment, the die and lid are encapsulated in a package such as a Tape Automated Bond package. In various other embodiments, the thicknesses of the die and the packaging material, and the height of the support regions of the lid, all may vary.

BRIEF DESCRIPTION OF THE DRAWINGS

The invention, together with further advantages thereof, may best be understood by reference to the following description taken in conjunction with the accompanying drawings in which:

FIGS. 5A and 5B are bottom and cross section views of a lid formed scribed from the transparent plate and used to cover the optical imaging circuitry on a die from the semiconductor wafer according to the present invention.

FIGS. 6a and 6b are perspective and cross section views of the lid mounted onto one of the die of the semiconductor wafer according to the present invention.

In the Figures, like reference numbers refer to like components and elements.

DETAILED DESCRIPTION OF THE INVENTION

Figure 1:
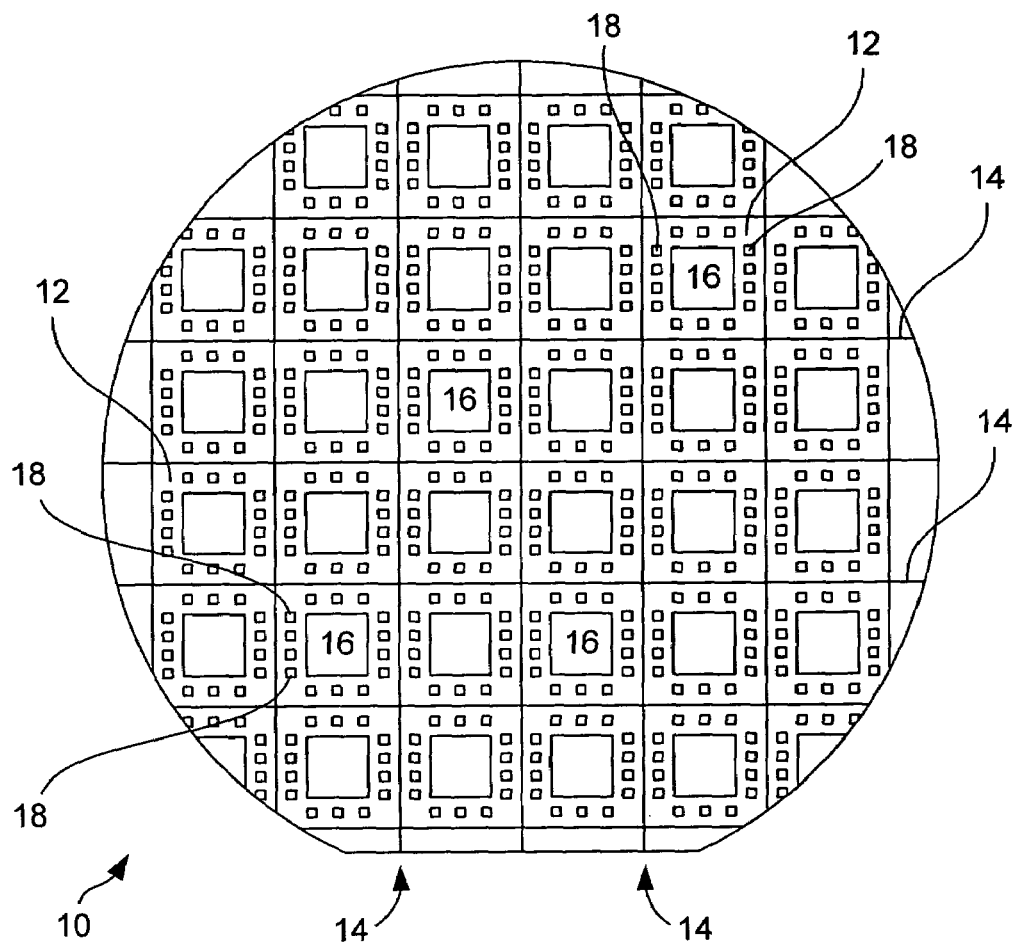
FIG. 1 is top view of a semiconductor wafer of optical imaging dice.

Referring to FIG. 1, a top view of a semiconductor wafer containing optical imaging dice is shown. The wafer 10 includes a plurality of individual die 12 separated by horizontal and vertical scribe lines 14. Each individual die 12 includes imaging circuitry 16 (sometimes referred to as the "pixel area"). A plurality of bond pads 18 are provided around the imaging circuitry 16 at the periphery of each die 12. Gold bumps (not shown) are formed on the bond pads 18 of each die 12 on the wafer 10.

Figure 2:
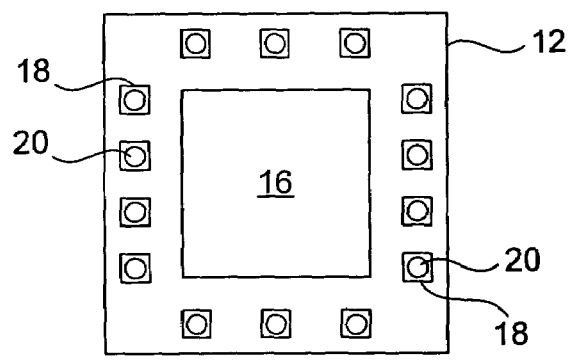
FIG. 2 is an exploded, top view of one of the die on the wafer of FIG. 1 according to the present invention.

Referring to FIG. 2, an exploded, top view of one of the die on the wafer of FIG. 1 according to the present invention is shown. The die 12 includes the pixel area or imaging circuitry 16 generally located in the center of the chip. Gold bumps 20 are formed on the bond pads 18 on the die. According to various embodiments of the invention, the imaging circuitry can be either CCD, CMOS, or any other type of image generating circuitry.

Figure 3:
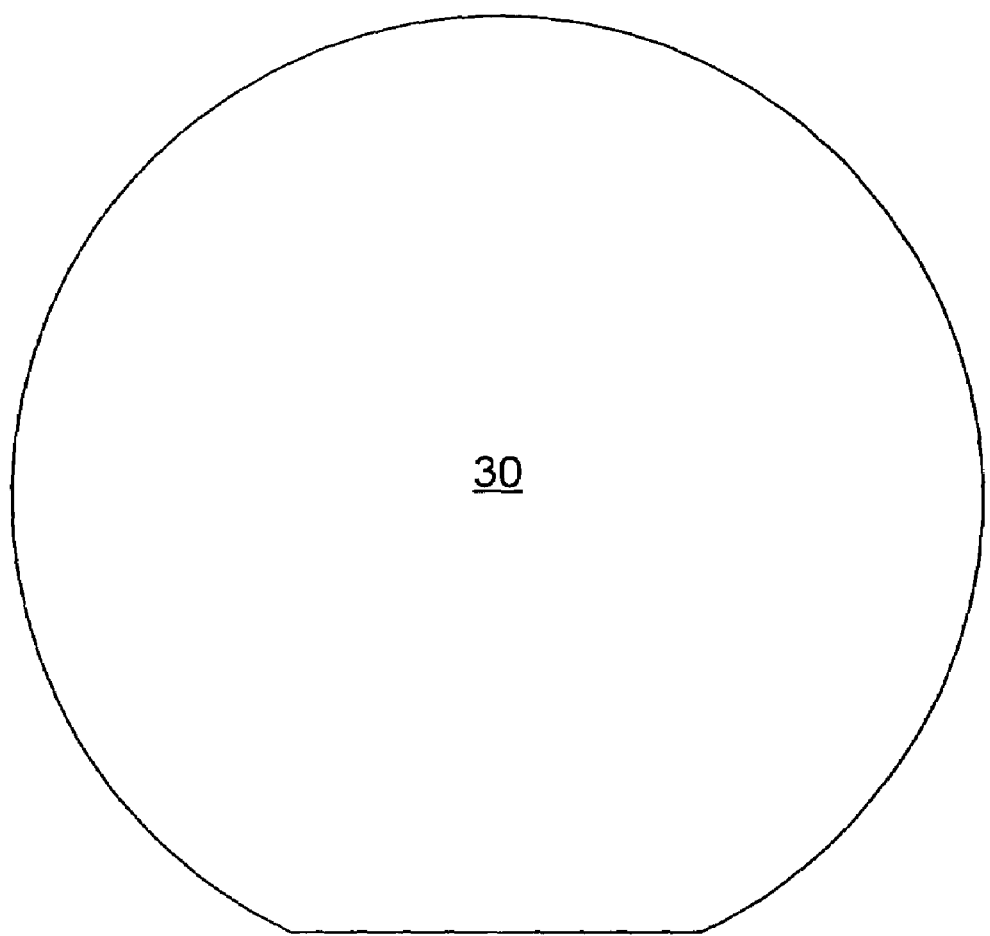
FIG. 3 is a top view of the transparent plate according to the present invention.

Referring to FIG. 3 a top view of a transparent plate is shown. In the embodiment shown, the transparent plate 30 is made from glass, has a thickness ranging from 0.3 to 0.7 millimeters, and has the same general shape as the wafer 10. In alternative embodiments, the transparent plate can be made from plastic or any other transparent material. The thickness can range from 0.3 millimeters or less or greater than 0.7 millimeters. The shape of the transparent plate 10 can also vary and does not necessarily have to be the same as the wafer 10. It can be round, square rectangular, or any other shape.

Figure 4:
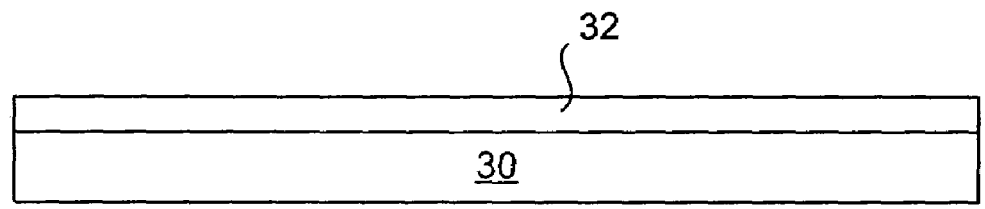
FIG. 4 is a cross-section of the transparent plate of FIG. 3 with a layer of photo-sensitive adhesive formed thereon according to the present invention.

Referring to FIG. 4, a cross-section of the transparent plate 30 with a layer 32 of photo-sensitive adhesive applied thereon is shown. According to one embodiment, the layer 32 is BCB manufactured by the Dow Chemical Corporation. The BCB is applied as a liquid and then distributed across the surface of the plate 30 using a well known spin-on process. In another embodiment, the layer 32 is AFP film manufactured by the Sumitomo Corporation of Japan. With this embodiment, the film is laminated onto the plate 30. In various embodiments, the thickness of the adhesive layer 32 may range from 0.1 to 50 microns with either material. In accordance with the present invention, the layer 32 is patterned using conventional mask and photolithography techniques. As is described in greater detail below, the plate 30 is scribed after being patterned to form a plurality of lids that are mounted onto the die 12 of the wafer 10. Each lid is patterned to remove the adhesive layer to form a transparent region that optically aligned with the imaging circuitry or pixel area when the lid is mounted onto the die. The layer 32 is generally left intact around the clear region of the lid.

Referring to FIGS. 5A and 5B, bottom and cross section views of a lid according to the present invention is shown. Each lid 40 includes a transparent region 42 and regions 44a–44d where the adhesive layer 32 is left intact. As best illustrated in FIG. 5B, the regions 44 form a support structure for supporting the transparent region 42 over the imaging circuitry when the lid 40 is flipped and mounted on a die 12. The height of the support structure varies depending on the thickness of the layer 32. As previously noted, the height of the support structure may vary from 0.1 to 50 microns. In other words, a gap ranging from 0.1 to 50 microns is provided between the imaging circuitry 16 and the transparent region 42 when the lid 40 is mounted onto the die 12.

Referring to FIG. 6A, a perspective view of a lid 40 mounted onto a die 12 according to the present invention is shown. The lid 40 is flipped and mounted on the die 12 so that the transparent region 42 is generally optically aligned or positioned over the imaging circuitry 16 (not shown) of the die 12. As illustrated in the cross section of FIG. 6B, a gap 46 ranging from 0.1 to 50 microns is provided between the imaging circuitry 16 and the transparent region 42 on the lid 40 depending on the height of the support structures 44a–44d.

Figure 7B:
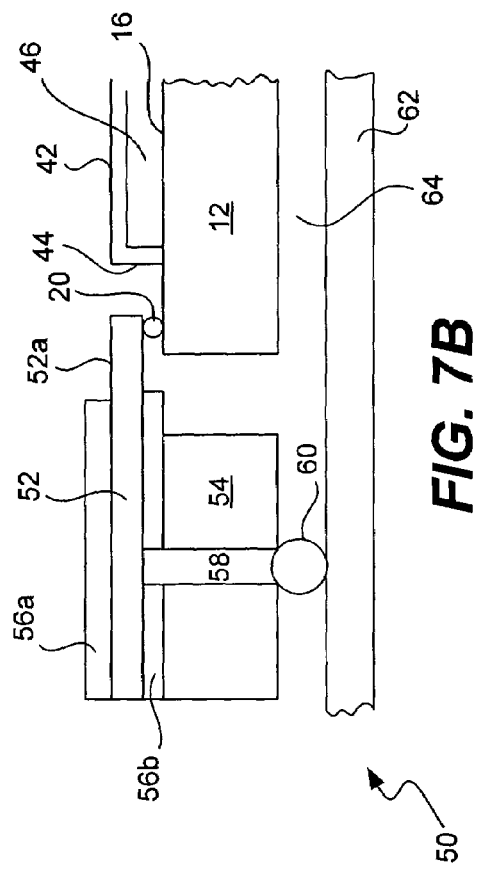
FIGS. 7A, 7B and 7C are various views of the semiconductor die and lid encapsulated in a Tape Automated Bond package according to the present invention.
Figure 7C:
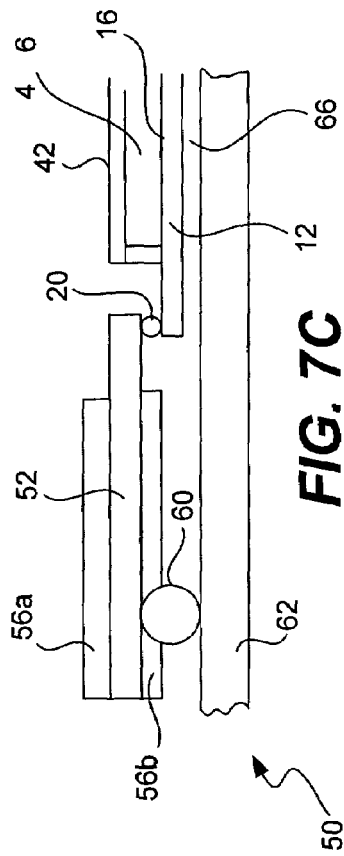
Figure 7A:
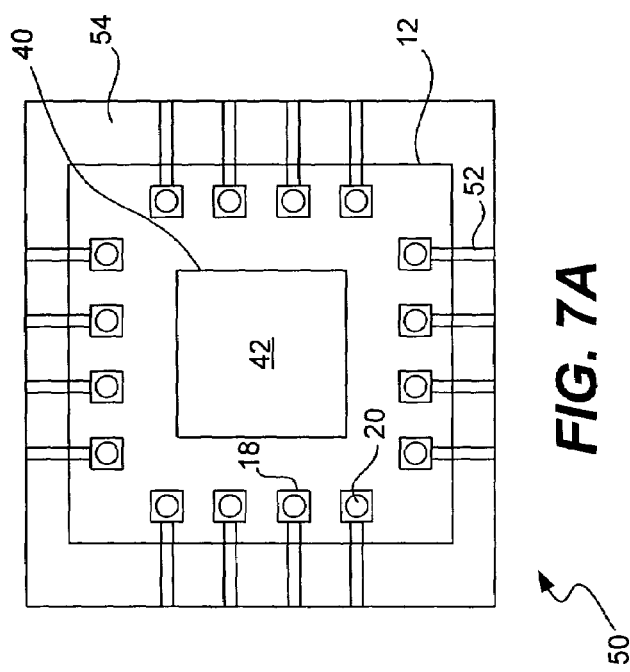

FIGS. 7A, 7B and 7C are various views of the die 12 and lid 40 encapsulated in a Tape Automated Bond (TAB) package according to the present invention.

FIG. 7A shows a top view of a TAB package 50. As illustrated, the lid 40 with the transparent region 42 is positioned over the imaging circuitry 16 (not shown) on the die 12. A plurality of leads 54 are provided around the periphery of the die 12 to contact the gold bumps 20 on the bond pads 18. The package 50 is encapsulated in a packaging material 54, such as FR4 or BT.

FIG. 7B illustrates a cross section of one of the leads 52 contacting a gold bump 20 on the die 12. The lead 52 is sandwiched between two insulating layers 56a and 56b such as polyimide. Insulating layer 56a is provided over the top of the lead 52. Insulating layer 56b is provided underneath the lead 52, between the lead 52 and the packaging material 54. A portion of the lead 52a in the vicinity of the gold bump 20 on the die 12 is exposed and is not covered with insulation. The exposed portion 52a of the lead 52 is bonded to a gold bump 20 using conventional semiconductor packaging techniques, such as heat, pressure, friction, ultrasound, or a combination thereof. A via 58 plated with an electrically conductive material such as copper, aluminum, gold or other conductor is provided within the packaging material 54 and the bottom polyimide layer 56b. The via provides an electrical connection between the lead 52 and a solder ball 60 provided on the bottom surface of the package 50. The solder ball 60 is used to provide an electromechanical contact between the package 50 and a substrate or printed circuit board 62 the package is to be mounted on. The circuitry on the die 12 thus communicates with other electrical components on the printed circuit board 62 through the bond pads 18, gold bumps 20, leads 52, vias 58 and solder balls 60. In the embodiment shown in FIG. 7B, the thickness of the die 12 and the package material 54 are approximately the same. Consequently, the height of the solder ball 60 raises the height of the die 12 so a space 64 exists between the package 50 and the printed circuit board 62. In one embodiment, the die has a thickness of approximately 0.7 millimeters. In other embodiments, the thickness of the die 12 can be either greater or less than 0.7 millimeters.

FIG. 7C illustrates another embodiment of the package 50. In this embodiment, the wafer 10 has been back-grinded after fabrication to reduce its thickness, for example to 0.2 or 1.0 millimeters or less. A thinner wafer enables the overall thickness of the package 50 to be reduced by reducing or altogether eliminating the packaging material 54 from the package. As such, the leads 52 of the package 50 are held in place by the insulating layers 56a and 56b. Solder ball 60 contacts the lead 52 through the insulating layer 56b. In one embodiment, the height of the solder ball 60 is greater than the thickness of the die 12 so that a space 66 is provided between the die 12 and the printed circuit board 62. In one specific embodiment, the thickness of the die 12 is 0.2 millimeters or less and the height of the solder ball 60 is 0.25 to 0.3 millimeters. In other embodiments, the thickness of the die 12 can be more than or less than 0.2 millimeters and the solder balls 60 can range in height from less than 0.25 millimeters or greater than 0.3 millimeters.

Figure 8:
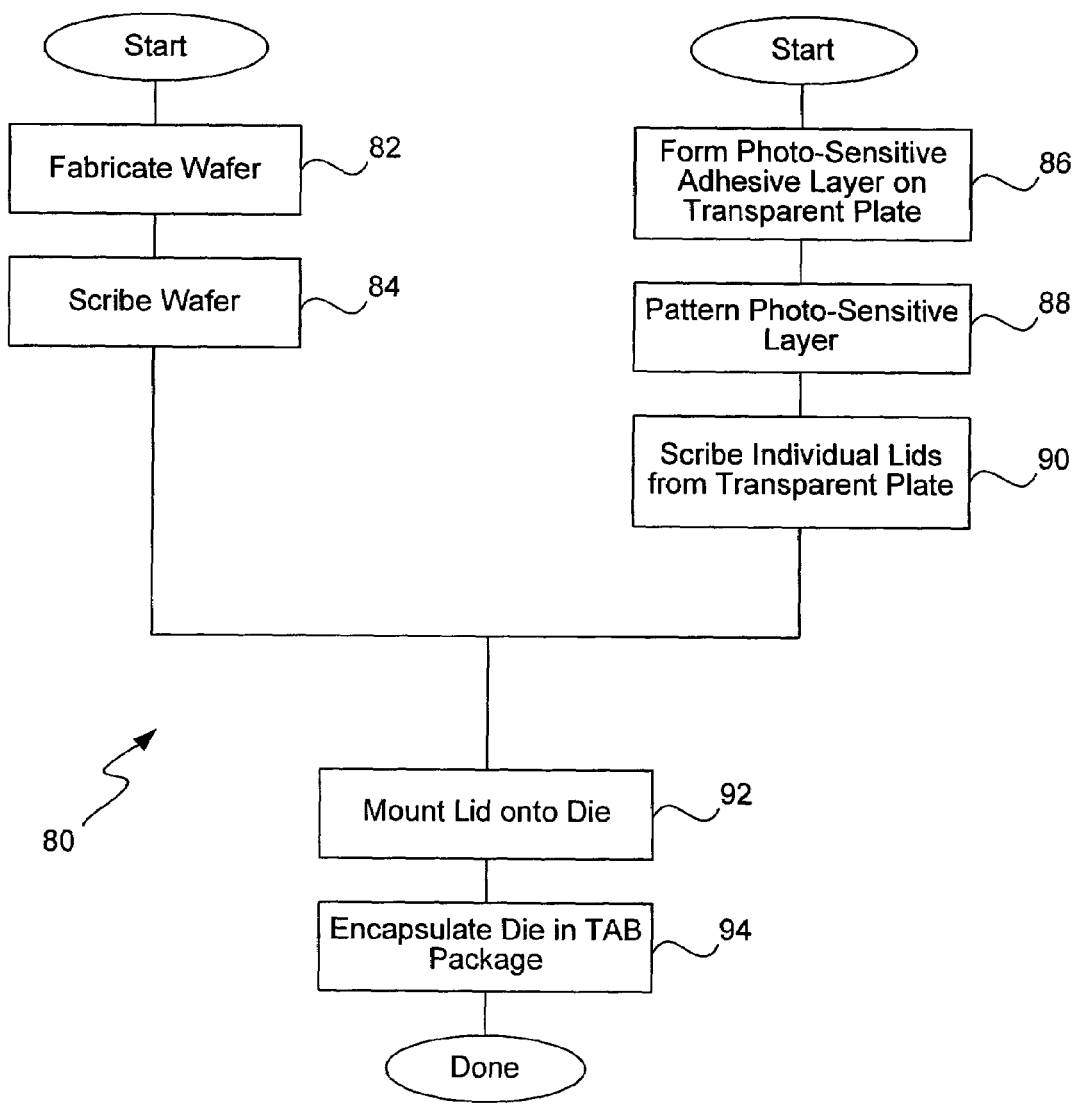
FIG. 8 is a flow chart illustrating the sequence of steps for packaging the image sensing chips according to the present invention.

Referring to FIG. 8, a flow chart 80 illustrating the sequence for making the package 50 is shown. In an initial step (box 82), the wafer 10 is fabricated with a plurality of die 12 formed thereon. As previously noted, each die 12 includes imaging circuitry 16. The wafer 10 is then scribed to form the individual die 12 (box 84). In another initial step, the photo-sensitive adhesive layer 32 is formed on the transparent plate 30 (box 86) and subsequently patterned (box 88) using conventional photolithography techniques. Individual lids 40 are thereafter scribed (box 90) from the wafer 10, each lid 40 having a patterned transparent region 42 and support region 44. A lid 40 is then mounted onto the die 12 (box 92) and then encapsulated in a TAB package ((box 94) to complete the sequence.

The present invention therefore provides a number of useful features. The height of the support structures 44a–44d can be readily controlled using conventional semiconductor fabrication techniques. As a result, the height of the gap between transparent plate 42 of the lid 40 and the imaging circuitry 16 on the die 12 can be precisely controlled. Furthermore, no optically transparent adhesive over the imaging circuitry is necessary. The imaging performance of the chip is therefore improved. The lid 40 is also attached to the die 12 relatively early in the packaging sequence. The imaging circuitry of the die 12 is therefore protected from contamination during subsequent packaging steps. Finally, the present invention takes advantage of a number of standard semiconductor packaging techniques, which helps reduce costs, increase yields, and improves reliability.

Although the foregoing invention has been described in some detail for purposes of clarity of understanding, it will be apparent that certain changes and modifications may be practiced within the scope of the appended claims. For example, many of the process steps described herein can be performed on the wafer level, such as the mounting of the lids 40 onto the dice 12 prior to scribing the wafer 10. Therefore, the described embodiments should be taken as illustrative and not restrictive, and the invention should not be limited to the details given herein but should be defined by the following claims and their full scope of equivalents.

We claim:

1. A method comprising:
   fabricating a die having imaging circuitry;
   fabricating a lid having a transparent region and support regions, the support regions having a predetermined height, the fabrication of the lid comprising:
      applying a photo-sensitive adhesive layer to a transparent plate; and
      patterning the photo-sensitive adhesive layer to form the transparent region and the support regions; and
   mounting the lid directly onto the die so that transparent region generally cover the imaging circuitry on the die but is separated from the imaging circuitry on the die by a gap having a dimension substantially equal to the predetermined height of the support regions of the lid.

2. The method of claim 1, wherein the patterning of the photo-sensitive adhesive layer is performed using photolithography.

3. The method of claim 1, further comprising the fabrication of a plurality of the lids by patterning the photo-sensitive adhesive layer applied to the transparent plate to form a plurality of transparent regions and corresponding support regions on the transparent plate.

4. The method of claim 1, further comprising scribing the patterned transparent plate to singulate the lids.

5. The method of claim 1, further comprising encapsulating the die with the lid mounted thereon into a package.

6. The method of claim 5, wherein the package is a Tape Automated Bond (TAB) package.

7. The method of claim 5, wherein the encapsulation further comprises:
   electrically coupling one or more leads to one or more contact bumps on the die; and
   providing insulation around the leads.

8. The method of claim 7, further comprising electrically coupling one or more solder balls to the one or more leads respectively.

9. The method of claim 8, wherein the electrically coupling the one or more solder balls to the one or more leads further comprises forming electrically conductive vias in a packaging material formed between the leads and the solder balls respectively.

10. The method of claim 5, wherein the encapsulation further comprises encapsulating the package in a packaging material.

* * * * *